(12) United States Patent
Hu et al.

(10) Patent No.: US 11,488,941 B2
(45) Date of Patent: Nov. 1, 2022

(54) LIGHT-EMITTING DEVICE

(71) Applicant: InnoLux Corporation, Miao-Li County (TW)

(72) Inventors: Shun-Yuan Hu, Miao-Li County (TW); Chin-Lung Ting, Miao-Li County (TW); Ker-Yih Kao, Miao-Li County (TW); Li-Wei Mao, Miao-Li County (TW)

(73) Assignee: INNOLUX CORPORATION, Miao-Li County (TW)

(*) Notice: Subject to any disclaimer, the term of this patent is extended or adjusted under 35 U.S.C. 154(b) by 35 days.

(21) Appl. No.: 16/861,412

(22) Filed: Apr. 29, 2020

(65) Prior Publication Data
US 2020/0350295 A1    Nov. 5, 2020

Related U.S. Application Data

(60) Provisional application No. 62/841,879, filed on May 2, 2019.

(30) Foreign Application Priority Data

Jan. 8, 2020  (CN) .......................... 202010017160.2

(51) Int. Cl.
*H01L 33/58* (2010.01)
*H01L 25/075* (2006.01)
(Continued)

(52) U.S. Cl.
CPC .......... *H01L 25/0753* (2013.01); *H01L 33/36* (2013.01); *H01L 33/505* (2013.01);
(Continued)

(58) Field of Classification Search
CPC ..... H01L 25/0753; H01L 33/58; H01L 33/60; H01L 2933/0083; H01L 27/156;
(Continued)

(56) References Cited

U.S. PATENT DOCUMENTS

2011/0249215 A1* 10/2011 Jung .................. G02F 1/133611
349/61
2012/0170253 A1* 7/2012 Park .................. G02F 1/133605
362/97.1
(Continued)

FOREIGN PATENT DOCUMENTS

CN    108803135 A    11/2018

OTHER PUBLICATIONS

Chinese language office action dated Apr. 19, 2021, issued in application No. CN 202010017160.2.

*Primary Examiner* — Feifei Yeung Lopez
(74) *Attorney, Agent, or Firm* — McClure, Qualey & Rodack, LLP

(57) ABSTRACT

A light-emitting device is provided, including a light-emitting unit and an optical layer. The light-emitting unit includes a light-emitting chip and an encapsulation disposed thereon. The optical layer is disposed on the light-emitting unit, the optical layer having a first region overlapping the light-emitting chip in a top view direction of the light-emitting device and a second region not overlapping the light-emitting chip in the top view direction of the light-emitting device, wherein the transmittance of the first region is less than the transmittance of the second region.

19 Claims, 13 Drawing Sheets

(51) Int. Cl.
  *H01L 33/52*   (2010.01)
  *H01L 33/60*   (2010.01)
  *H01L 33/36*   (2010.01)
  *H01L 33/50*   (2010.01)
  *H01L 25/16*   (2006.01)
(52) U.S. Cl.
  CPC .............. *H01L 33/52* (2013.01); *H01L 33/58* (2013.01); *H01L 33/60* (2013.01); *H01L 25/167* (2013.01); *H01L 2933/0083* (2013.01)
(58) Field of Classification Search
  CPC ......... H01L 33/10; H01L 33/46; H01L 33/56; F21K 9/68
  See application file for complete search history.

(56) References Cited

U.S. PATENT DOCUMENTS

| | | | |
|---|---|---|---|
| 2013/0188114 A1* | 7/2013 | Sugaya | G09F 13/04 349/62 |
| 2015/0155439 A1* | 6/2015 | Cich | H01L 33/16 362/294 |
| 2017/0059937 A1* | 3/2017 | Kim | G02F 1/133605 |
| 2018/0023784 A1* | 1/2018 | Tamura | F21V 7/0083 362/235 |

* cited by examiner

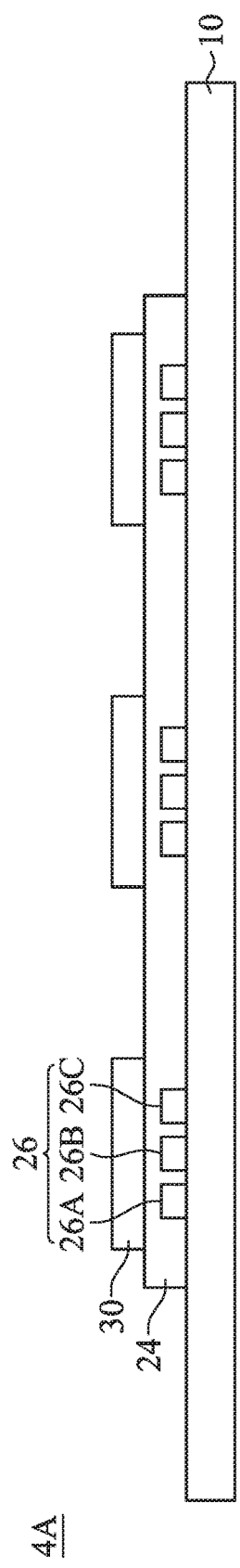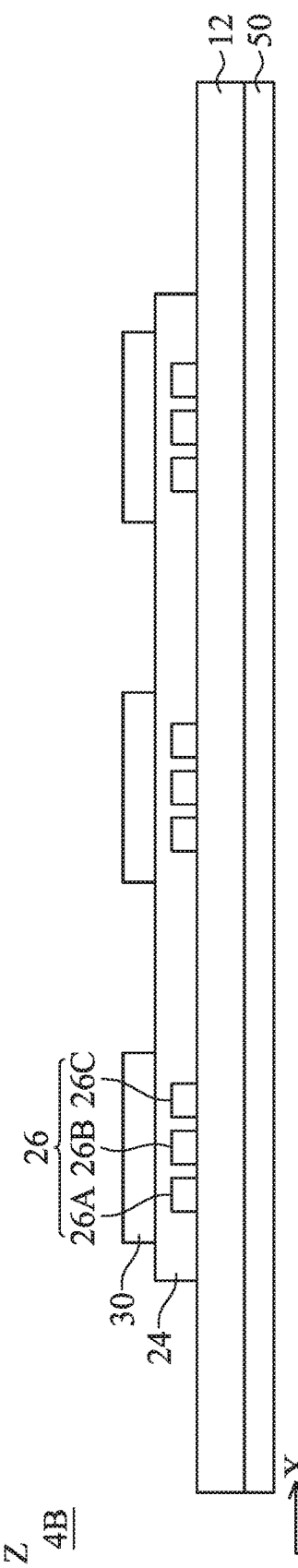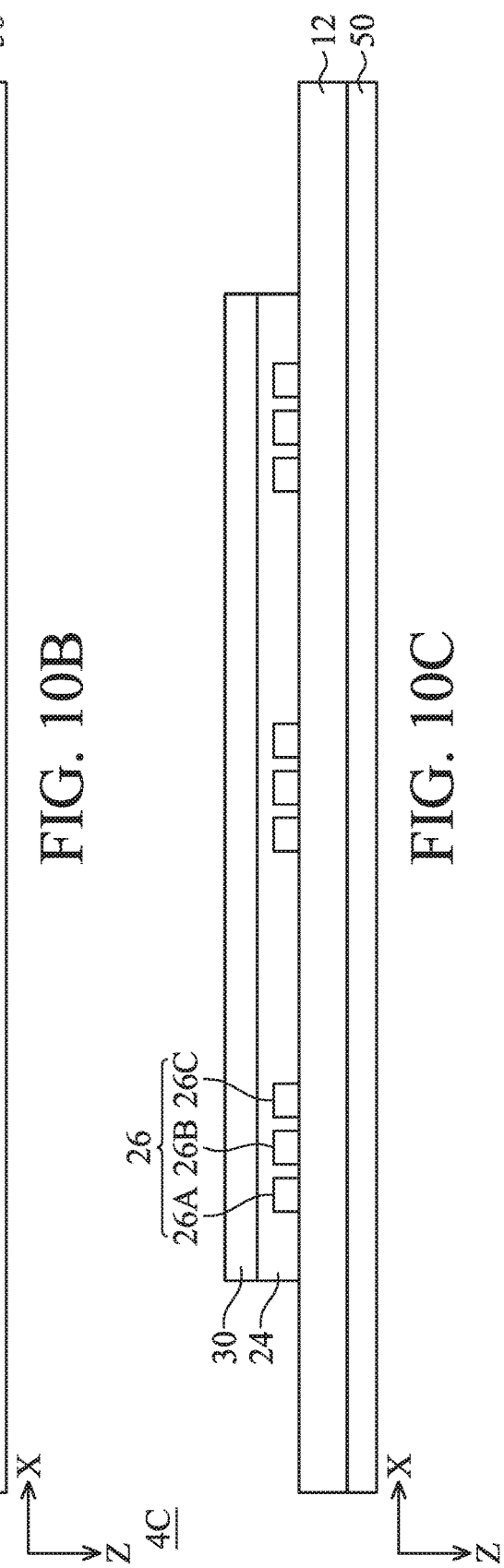

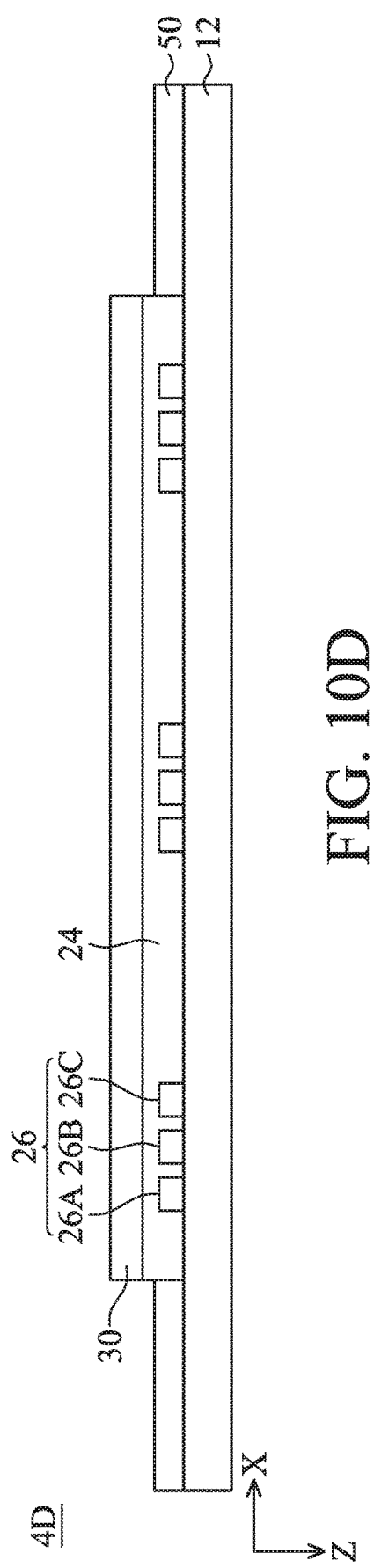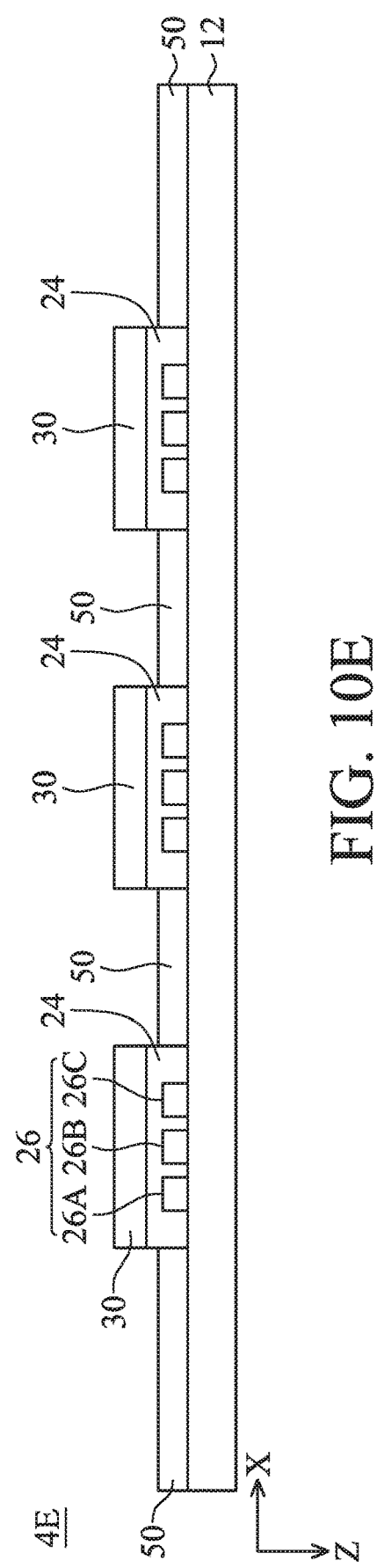

LIGHT-EMITTING DEVICE

CROSS-REFERENCE TO RELATED APPLICATIONS

The present application claims priority to U.S. provisional Application No. 62/841,879, filed on May 2, 2019, and China Patent Application No. 202010017160.2, filed on Jan. 8, 2020, which are incorporated by reference herein in its entirety.

BACKGROUND

Field

The disclosure relates to a light-emitting device and an electronic device, and particularly to a light-emitting diode (LED) light-emitting device and an LED electronic device.

Description of the Related Art

Nowadays, light-emitting diodes are widely used. However, there are problems that still need to be overcome, such as that the light-emitting intensity decays rapidly as viewing angle increases. As a result, the industry still try to develop a light-emitting device with a structure that can improve the performance of the light-emitting diode.

SUMMARY

A light-emitting device is provided, including a light-emitting unit and an optical layer. The light-emitting unit includes a light-emitting chip and an encapsulation disposed thereon. The optical layer is disposed on the light-emitting unit, the optical layer having a first region overlapping the light-emitting chip in a top view direction of the light-emitting device and a second region not overlapping the light-emitting chip in the top view direction of the light-emitting device, wherein the transmittance of the first region is less than the transmittance of the second region.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 10A to 10E are schematic views of some elements of light-emitting devices in some embodiments of the present disclosure.

DETAILED DESCRIPTION OF THE DISCLOSURE

Figure 1A:
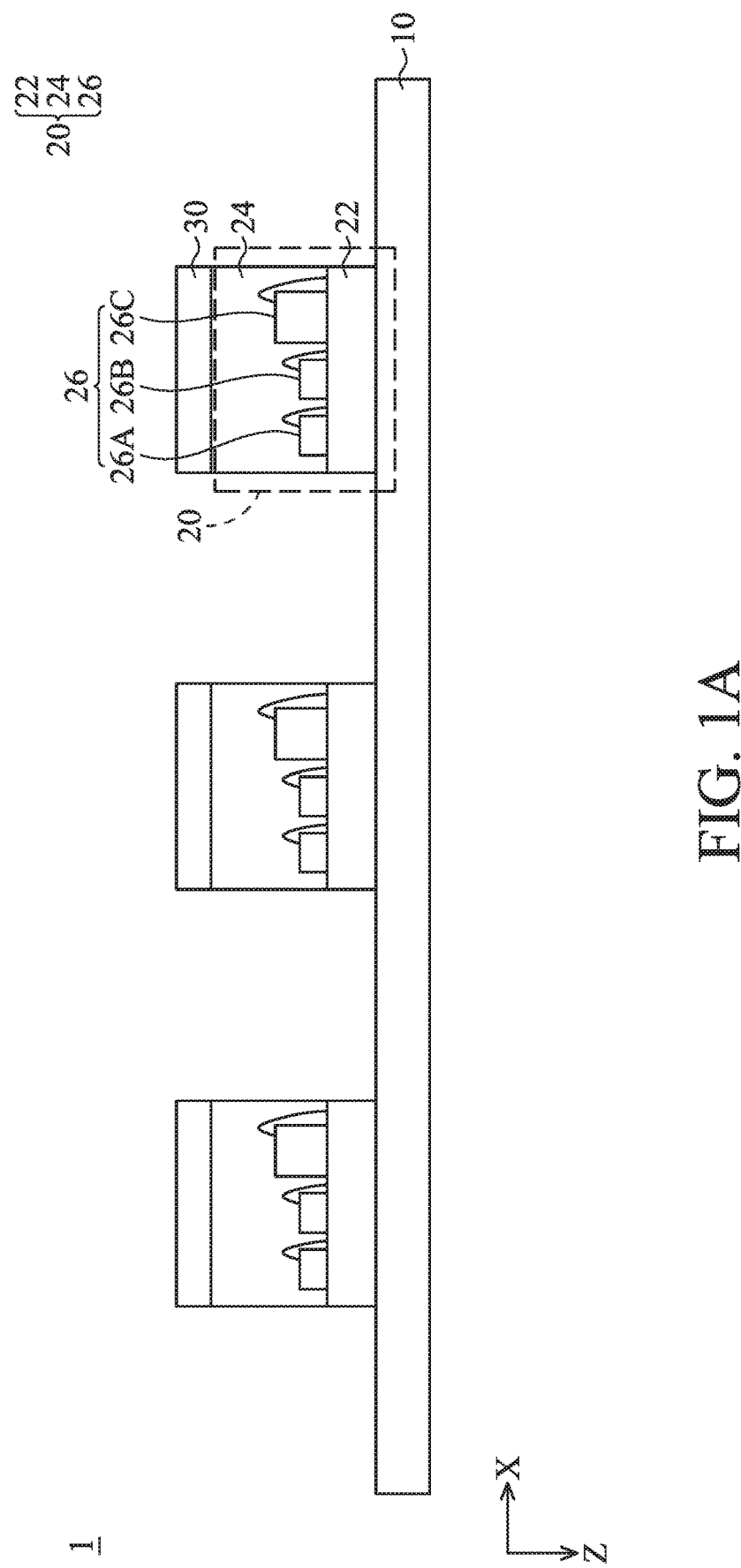
FIG. 1A is a schematic view of some elements of a light-emitting device in some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed with interposing the features, such that the features may not be in direct contact. In addition, spatially relative terms, such as "vertically," "above," "over," "below,", "bottom," etc. as well as derivatives thereof (e.g., "downwardly," "upwardly," etc.) are used in the present disclosure for ease of describing the spatial relationship between one features and another feature. The spatially relative terms are intended to cover different orientations of the device including the features.

The terms "about" and "substantially" typically mean a range of +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value still implies the meaning of "about" or "substantially".

In addition, in some embodiments of the present disclosure, terms concerning attachments, coupling and the like, such as "connected" and "interconnected", which refer to a relationship wherein structures are secured or attached to one another either directly or indirectly through intervening structures, as well as both movable or rigid attachments or relationships, unless expressly described otherwise.

Furthermore, the phrase "in a range between a first value and a second value" or "in a range from a first value to a second value" indicates that the range includes the first value, the second value, and other values between them.

FIG. 1A is a schematic view of some elements of a light-emitting device 1 in some embodiments of the present disclosure. The light-emitting device 1 in some embodiments of the present disclosure may include some elements of a flexible display, a touch display, a curved display, or a free shape display, but it is not limited thereto. In some embodiments, the light-emitting device 1 may mainly include a substrate 10, a plurality of light-emitting units 20 disposed on the substrate 10, and optical layers 30 disposed on the light-emitting units 20.

In some embodiments, the substrate 10 may be an array substrate, such as a driving substrate for the light-emitting units 20. In detail, the substrate 10 may include thin-film transistors (TFT) or driving circuits (not shown), but it is not limited thereto. The driving circuit may be an active driving circuit or a passive driving circuit. In some embodiments, the driving circuit may include transistors (such as switching transistor or driving transistor), data lines, scanning lines, conductive pads, dielectric layers or other circuits, but it is not limited thereto. The switching transistor may control the light-emitting units 20 to be activated or deactivated. In some embodiments, the driving circuit may couple to integrated circuits (IC) or microchips to control the light-emitting unit 20.

In some embodiments, the material of the substrate 10 may include glass, quartz, sapphire, polycarbonate (PC), polyimide (PI), polyethylene terephthalate (PET), rubber, glass fiber, ceramic, other suitable materials or a combination thereof, but it is not limited thereto. In some embodiments, the substrate 10 may include metal-glass fiber composite board, printed circuit board (PCB), flexible printed circuit (FPC), but it is not limited thereto.

In some embodiments, the light-emitting unit 20 may act as a light source of the light-emitting device 1, and may mainly include an encapsulation substrate 22, an encapsulation 24 disposed on the encapsulation substrate 22, and a light-emitting chip assembly 26 disposed in the encapsulation substrate 24. The material of the encapsulation substrate 2 may be bismaleimide triazine (BT) resin, polyimide, epoxy glass fiber, ceramic, etc., but the present disclosure is not limited thereto. In some embodiments, circuits may be disposed in/on the encapsulation substrate 22 to make the light-emitting chip assembly 26 electrically connect to the substrate 10 through the encapsulation substrate 22. The material of the encapsulation 24 may be silicon, epoxy resin, etc., but the present disclosure is not limited thereto. The encapsulation 24 may act as a protective layer to protect the light-emitting chip assembly 26 disposed therein.

In some embodiments, the encapsulation 24 may be formed from chemical vapor deposition (CVD), coating, printing, inkjet printing, compression molding, other suitable methods or a combination thereof, or the encapsulation 24 may be formed by one or more photolithography processes and etching processes.

In some embodiments, the light-emitting chip assembly 26 may include a plurality of light-emitting chips (such as light-emitting chip 26A, light-emitting chip 26B and light-emitting chip 26C in FIG. 1A) which can emitting light having an identical color or different colors (such as red, green, blue, or white lights) but the present disclosure is not limited thereto. In some embodiments, the light-emitting chip 26A, light-emitting chip 26B and light-emitting chip 26C may include organic light-emitting diode (OLED), quantum dot light-emitting diode (QLED/QDLED), light-emitting diode (LED). The light-emitting diode may include micro LED or mini LED, etc.

Figure 1B:
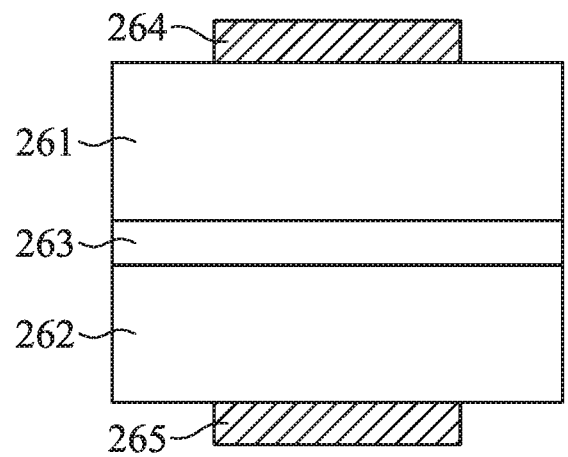
FIGS. 1B and 1C are cross-sectional views of light-emitting chips in some embodiments of the present disclosure.
Figure 1C:
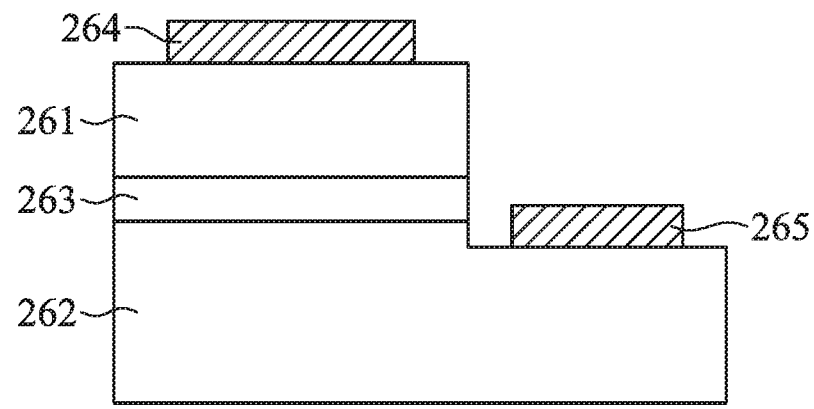

Referring to FIGS. 1B and 1C, FIGS. 1B and 1C show cross-sectional views of the light-emitting chip 26A (or the light-emitting chip 26B or the light-emitting chip 26C) in some embodiments of the present disclosure. As shown in FIG. 1B, the light-emitting chip 26A may be a vertical type light-emitting chip, according to some embodiments. As shown in FIG. 1C, the light-emitting chip 26A may be a flip-chip type light-emitting chip, according to other embodiments. However, the present disclosure is not limited thereto.

In particular, the light-emitting chip 26A (or the light-emitting chip 26B or the light-emitting chip 26C) may include a first semiconductor layer 261, a second semiconductor layer 262, and an active layer 263. The active layer 263 may be disposed between the first semiconductor layer 261 and the second semiconductor layer 262. In some embodiments, one of the first semiconductor layer 261 and the second semiconductor layer 262 may be used to provide and/or transport electrons, and the other may be used to provide and/or transport electron holes. In some embodiments, the first semiconductor layer 261 and the second semiconductor layer 262 may include a n-type semiconductor material and a p-type semiconductor material, respectively. However, in some other embodiments, the first semiconductor layer 261 and the second semiconductor layer 262 may include a p-type semiconductor material and a n-type semiconductor material, respectively.

In some embodiments, the n-type semiconductor material may include, but is not limited to, gallium nitride (n-GaN) or aluminum indium phosphide (n-AlInP), which are doped with tetravalent atoms. In addition, the p-type semiconductor material having may include, but is not limited to, gallium nitride (p-GaN) or aluminum indium phosphide (p-AlInP), which are doped with divalent atoms. Moreover, in some embodiments, the active layer 206 may have a quantum well structure. For example, the active layer 206 may include a single quantum well (SQW), a multiple quantum well (MQW), a nanowire, other suitable structures, or a combination thereof. In some embodiments, the material of the active layer 206 may include, but is not limited to, gallium nitride, aluminum indium phosphide (AlInP), indium gallium nitride (InGaN), or a combination thereof, but it is not limited thereto.

In some embodiments, the first semiconductor layer 261, the second semiconductor layer 262, and the active layer 263 may be formed by an epitaxial growth process. The epitaxial growth process may include, but is not limited to, a molecular beam epitaxy (MBE) process, a liquid phase epitaxy (LPE) process, a solid phase epitaxy (SPE) process, a vapor phase epitaxy (VPE) process, a selective epitaxial growth (SEG) process, a metal organic chemical vapor deposition (MOCVD) process, an atomic layer deposition (ALD) process or a combination thereof.

In addition, in some embodiments, the light-emitting chip 26A may also include a first electrode layer 264 and a second electrode layer 265 that are disposed on the first semiconductor layer 261 and the second semiconductor layer 262. Specifically, in the embodiments where the vertical type light-emitting chip 26A, the first electrode layer 264 and the second electrode layer 265 are disposed on two opposite sides (as shown in FIG. 1B). In the embodiments of the flip-chip type light-emitting chip 26A, the first electrode layer 264 and the second electrode layer 265 are disposed on the same side (as shown in FIG. 1C).

In some embodiments, the first electrode layer 264 and the second electrode layer 265 may be further electrically connected to the signal line (not illustrated) and the driving circuit (not illustrated) of the substrate 10. In some embodiments, the material of the first electrode layer 264 and the second electrode layer 265 may include a conductive metal material. For example, the conductive metal material may include, but is not limited to, copper (Cu), aluminum (Al), tungsten (W), titanium (Ti), gold (Au), platinum (Pt), nickel (Ni), tin (Sn), indium (In), an alloy thereof, other suitable conductive materials, or a combination thereof, but it is not limited thereto.

In some embodiments, the first electrode layer 264 and/or the second electrode layer 265 may be formed by one or more deposition processes, photolithography processes, and etching processes. In some embodiments, the deposition process may include a chemical vapor deposition process, a physical vapor deposition process, an electroplating process, an electroless plating process, other suitable processes, or a combination thereof. In addition, in some embodiments, the photolithography process may include photoresist coating (e.g., spin coating), soft baking, hard baking, mask aligning, exposure, post-exposure baking, developing the photoresist, rinsing, drying, or another suitable process. In some embodiments, the etching process may include a dry etching process, a wet etching process, or another suitable etching process.

It should be understood that, in accordance with some embodiments, the structure of the light-emitting chip 26A may be adjusted or additional elements may be disposed in or on the light-emitting chip 26A according to requirements. The light-emitting chip 26A of the present disclosure is not limited to the structures as described above.

Refer to FIG. 1A. In some embodiments, the optical layer 30 may include, materials having high reflectance, such as metals or other complex materials having different refractive indexes, but the present disclosure is not limited thereto. In some embodiments, the metals may be silver, aluminum, gold, nickel, another suitable material, or a combination thereof, but it is not limited thereto. The complex material may include $TiO_2$, $SiO_2$, $Nb_2O_5$, $Ta_2O_5$, $ZrO_2$, $Al_2O_3$, $Y_2O_3$, MgO, other suitable materials, or a combination thereof, but it is not limited thereto.

In the embodiments wherein the optical layer 30 includes the complex materials, the optical layer 30 may be a distributed Bragg reflector (DBR). In particular, at least a portion of light may be reflected in an interface between different mediums when light passes through the mediums, and the reflectivity is related to the refractive indexes of the mediums. As a result, if thin films having different refractive indexes are stacked periodically, a portion of light reflected by the layers may perform constructive interference and combine with some other portion of the light due to phase angle changing when light passing through the thin films having different refractive indexes, so at least a portion of the light may be reflected and the thin films may form a distributed Bragg reflector. However, the present is not limited thereto. The optical layer 30 may be formed of different metals having different transmittances to reflect the light or allow the light passing through.

In some embodiments, the optical layer 30 may also include an omni-directional reflector (ODR) structure. In particular, the omni-directional reflector structure may include a stack of dielectric material/metal reflective material/dielectric material. In some embodiments, the dielectric material may include, but is not limited to, silicon oxide ($SiO_x$), silicon nitride ($SiN_x$), silicon oxynitride (SiON), aluminum oxide ($Al_2O_3$), titanium dioxide ($TiO_2$), other suitable materials, or combination thereof, but the present disclosure is not limited thereto. In some embodiments, the metal reflective material may include, but is not limited to, copper, aluminum, indium, ruthenium, tin, gold, platinum, zinc, silver, titanium, lead, nickel, chromium, magnesium, palladium, an alloy thereof, other suitable materials or a combination thereof, but it is not limited thereto.

Figure 2A:
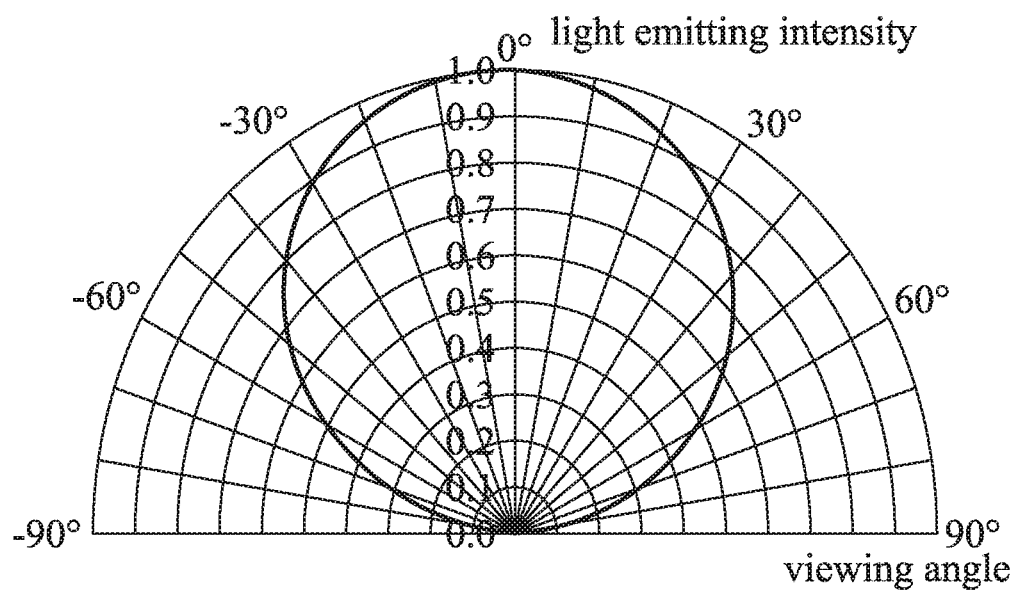
FIGS. 2A and 2B are schematic views showing the relationship between the light-emitting intensity of light-emitting units and viewing angles of the present disclosure.
Figure 2B:
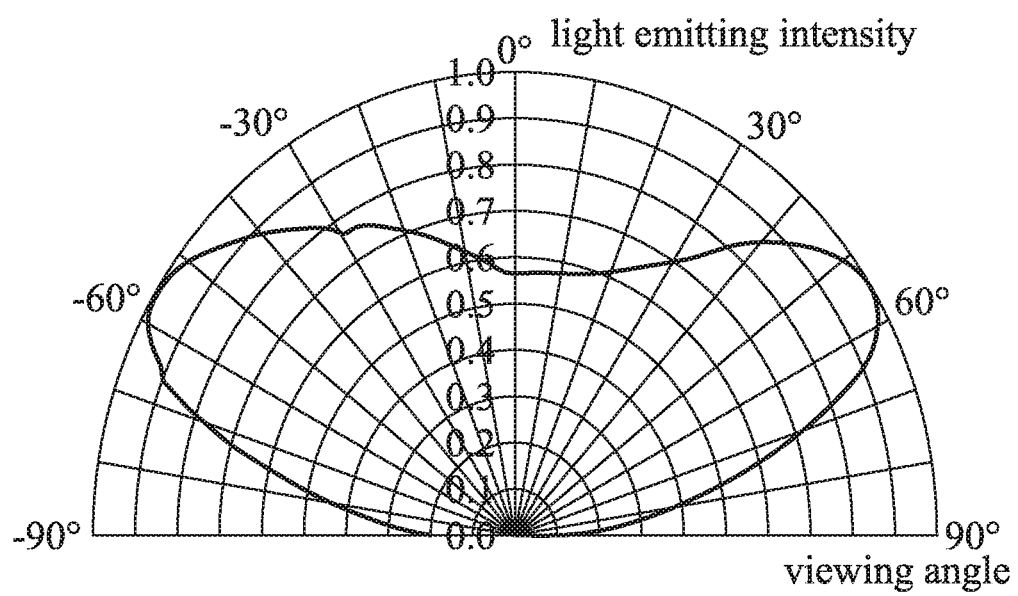

As a result, a portion of the light emitted from the light-emitting unit 20 may be reflected by the optical layer 30 and turn to emit from the sides where no optical layer 30 is positioned, so the viewing angle of the light-emitting device 1 may be changed. For example, FIGS. 2A and 2B are schematic views showing the relationship between the light-emitting intensity of the light-emitting unit and view angles of the present disclosure. The light-emitting unit 20 in FIG. 2A does not have the optical layer 30, and the light-emitting unit 20 in FIG. 2B has the optical layer 30. In FIG. 2A, the light-emitting unit 20 substantially has the highest light-emitting intensity when the viewing angle is 0 degree (i.e. in a top view direction Z in which the substrate 10 is being observed), and the light-emitting intensity is decreased as the viewing angle increases. It should be noted that "the top view direction in which the substrate is being observed" here is briefed as "the top view direction" for simplicity in the following paragraphs.

However, in FIG. 2B, the optical layer 30 is provided to reflect the light at a small viewing angle (close to the top view direction), so at least a portion of the light may be emitted from the sides where no optical layer 30 is provided, i.e. emitted from the position having a larger viewing angle. As a result, the highest light-emitting intensity of the light-emitting device in FIG. 2B is not when the viewing angle is at 0 degree (parallel to the top view direction), and the light-emitting intensity may be increased as the viewing angle increases, until a specific angle is reached. For example, this angle may be about 60 degrees in FIG. 2B, but the present disclosure is not limited thereto. Afterwards, the light-emitting intensity may be decreased as the viewing angle increases. Therefore, the problem of the light-emitting intensity decaying rapidly along the viewing angle may be solved.

In some embodiments, the optical layer 30 may be formed from aforementioned deposition, coating, printing, inkjet printing, compression molding, other suitable methods or a combination thereof, or the optical layer 30 may be formed by one or more photolithography processes and etching processes.

Figure 3A:
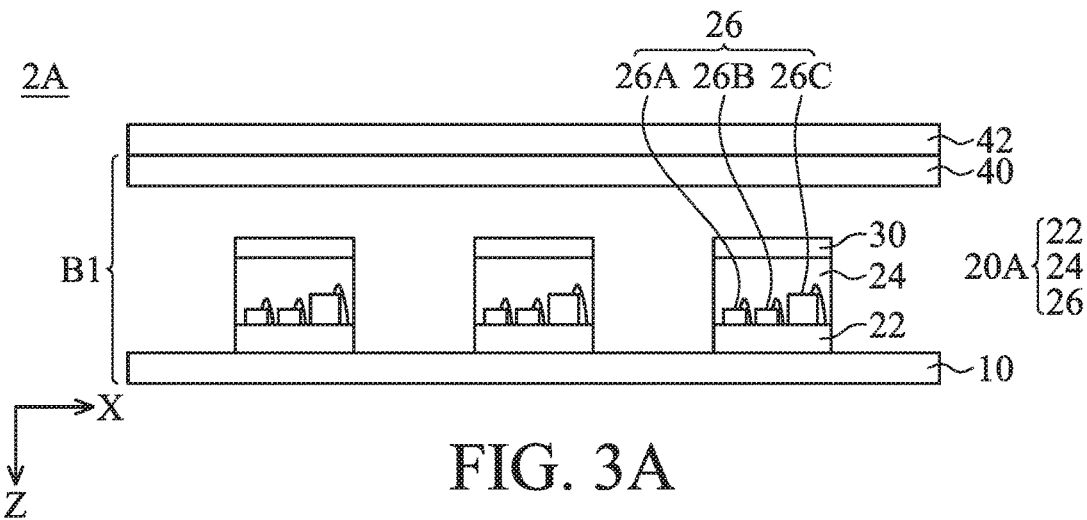
FIGS. 3A to 3C are schematic views of light-emitting devices in some embodiments of the present disclosure.
Figure 3B:
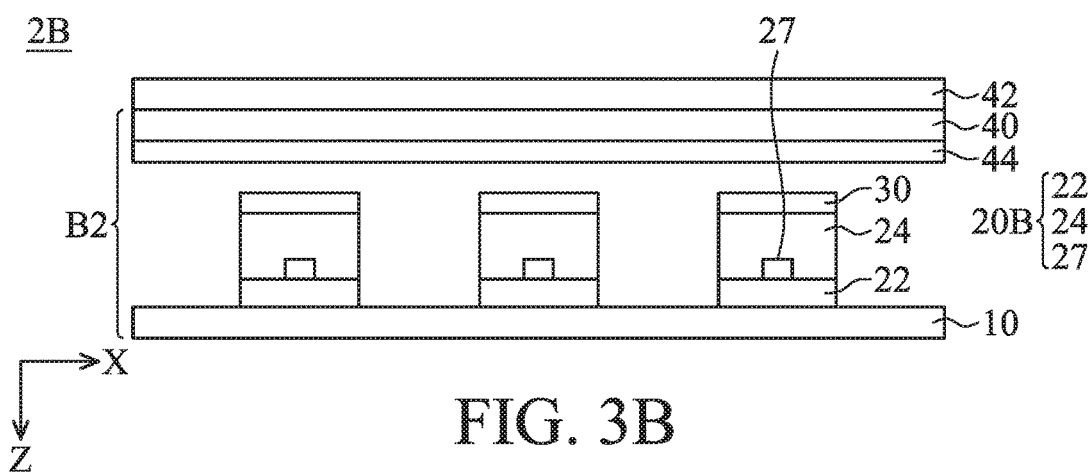
Figure 3C:
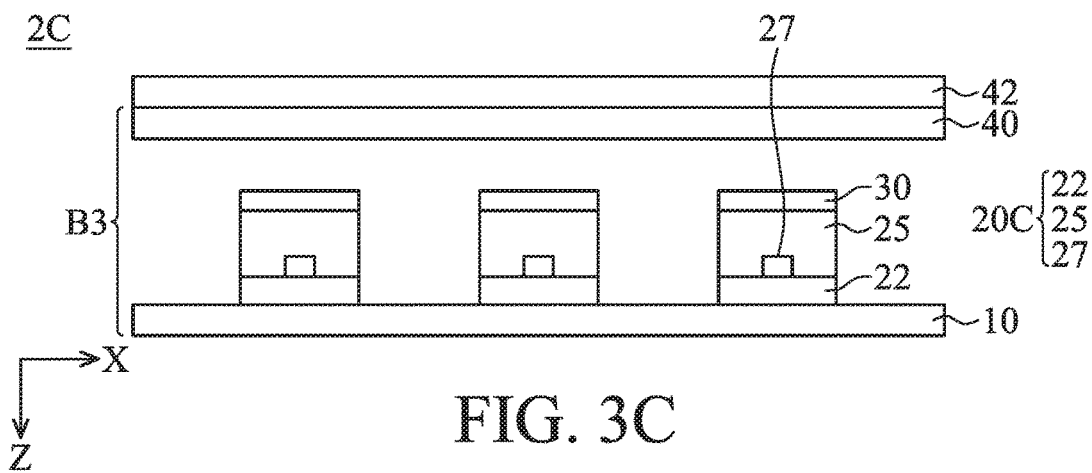

FIGS. 3A to 3C are schematic views of the light-emitting device 2A, light-emitting device 2B, and light-emitting device 2C in some embodiments of the present disclosure, respectively. The light-emitting device 2A mainly includes a backlight unit B1 (which includes the substrate 10, the light-emitting unit 20A, the optical layer 30, and an optical film 40) and a display layer 42 disposed on the backlight unit B1. For example, the optical film may be a prism film, a diffusion film, a dual brightness enhancement film (DBEF), a quantum dot film, etc., but it is not limited thereto. Furthermore, the optical film 40 may be affixed by mechanisms, adhesives or other methods. The display layer 42 may selectively include liquid crystal (LC), quantum dot, fluorescence material, phosphor material, OLED, other display medium, or a combination thereof, but the present disclosure is not limited thereto. Additional adhesive or mechanisms (not shown) may be provided between the substrate 10 and the optical film 40 to connect or affix the substrate 10 and the optical film 40.

The light-emitting unit 20A may have a structure similar to the light-emitting unit 20, but the present disclosure is not limited thereto. For example, in FIG. 3B, the light-emitting unit 20B of the backlight unit B2 may include the encapsulation substrate 22, the encapsulation 24, and a light-emitting chip 27 disposed in the encapsulation 24. Furthermore, the backlight unit B2 further includes a wavelength conversion layer 44 disposed on the optical layer 30. In some embodiments, the light-emitting chip 27 may provide light having short wavelength to visible light wavelength. For example, the range of the wavelength may be between about 10 nm to about 780 nm. However, the present disclosure is not limited thereto. In some embodiments, the light-emitting chip 27 may provide infrared or far infrared. In some embodiments, the light-emitting chip 27 may provide blue light or ultraviolet (UV), and the wavelength conversion layer 44 may convert the light emitted from the light-emitting chip 27 to the light having the desired wavelength (such red light, green light or white light, but it is not limited thereto). For example, in some embodiments, the wavelength conversion layer 44 may be patterned and disposed corresponding to the light-emitting unit 20B to convert the lights emitted from different light-emitting chips 27 to lights having different wavelengths. In some embodiments, the positions of the optical film 40 and the wavelength conversion layer 44 may be changed, which means that the wavelength conversion layer 44 may be positioned between the optical film 40 and the display layer 42. In some embodiments, the wavelength conversion layer 44 may be a light filter to filter light of certain wavelengths, so the light emitted from the light-emitting chip 27 may have the desired wavelength after passing through the wavelength conversion layer 44.

However, the present disclosure is not limited thereto. In FIG. 3C, the backlight unit B3 of a light-emitting device 2C does not have the wavelength conversion layer in the aforementioned embodiments, and the light-emitting chip 27 is covered by an encapsulation 25 having light conversion mediums to make the light-emitting unit 20C (which includes the encapsulation substrate 22, the encapsulation 25 and the light-emitting chip 27) directly emit light having the desired wavelength (such as red light, green light or white light, but it is not limited thereto). The backlight unit B1, backlight unit B2, and backlight unit B3 may be, for example, light sources for the display layer 42 to display images. Similarly, in some embodiments, the encapsulation 25 may be a light filter as well.

The encapsulation 25 or the wavelength conversion layer 44 may convert the wavelength of light, such as converting the light emitted from the light-emitting chip 27 to the light having specific wavelength range (i.e. having specific color). In some embodiments, the encapsulation 25 or the wavelength conversion layer 44 may include base material and particles distributed in the base material. In some embodiments, the base material may include organic polymer, inorganic polymer, glass, or a combination thereof, but it is not limited thereto. In some embodiments, the base material may be transparent or translucent.

In some embodiments, the particles may include, but are not limited to, phosphors, quantum dot (QD) materials, organic fluorescent materials, or a combination thereof, but it is not limited thereto. In some embodiments, the encapsulation 25 or the wavelength conversion layer 44 may include phosphors that can convert the light source into red light, green light, blue light or light having any other suitable color. In some embodiments, the quantum dot material may have a core-shell structure. The core structure may include, but is not limited to, CdSe, CdTe, CdS, ZnS, ZnSe, ZnO, ZnTe, InAs, InP, GaP, other suitable materials or a combination thereof, but it is not limited thereto. The shell structure may include, but is not limited to, ZnS, ZnSe, GaN, GaP, other suitable materials or a combination thereof, but it is not limited thereto.

In addition, in some embodiments, the encapsulation 25 or the wavelength conversion layer 44 may include scatter particles. For example, the scattering particles may have a high reflection coefficient (e.g., greater than 30%). The scattering particles may further increase light absorption efficiency of the quantum dot material or change the light intensity distribution at different viewing angles. In some embodiments, the material of the scattering particles may include titanium (Ti) or zinc (Zn). For example, in some embodiments, the scattering particles may include, but are not limited to, titanium dioxide ($TiO_2$), niobium-doped titanium oxide (TNO), zinc oxide (ZnO), zirconium dioxide ($ZrO_2$) or a combination thereof, but the present disclosure is not limited thereto.

In some embodiments, the encapsulation 25 or the wavelength conversion layer 44 may be formed by a chemical vapor deposition process, a coating process, a printing process, an inkjet printing process, compression molding, other suitable processes, or a combination thereof. Moreover, the encapsulation 25 or the wavelength conversion layer 44 may be formed by one or more photolithography processes and etching processes.

Figure 4:
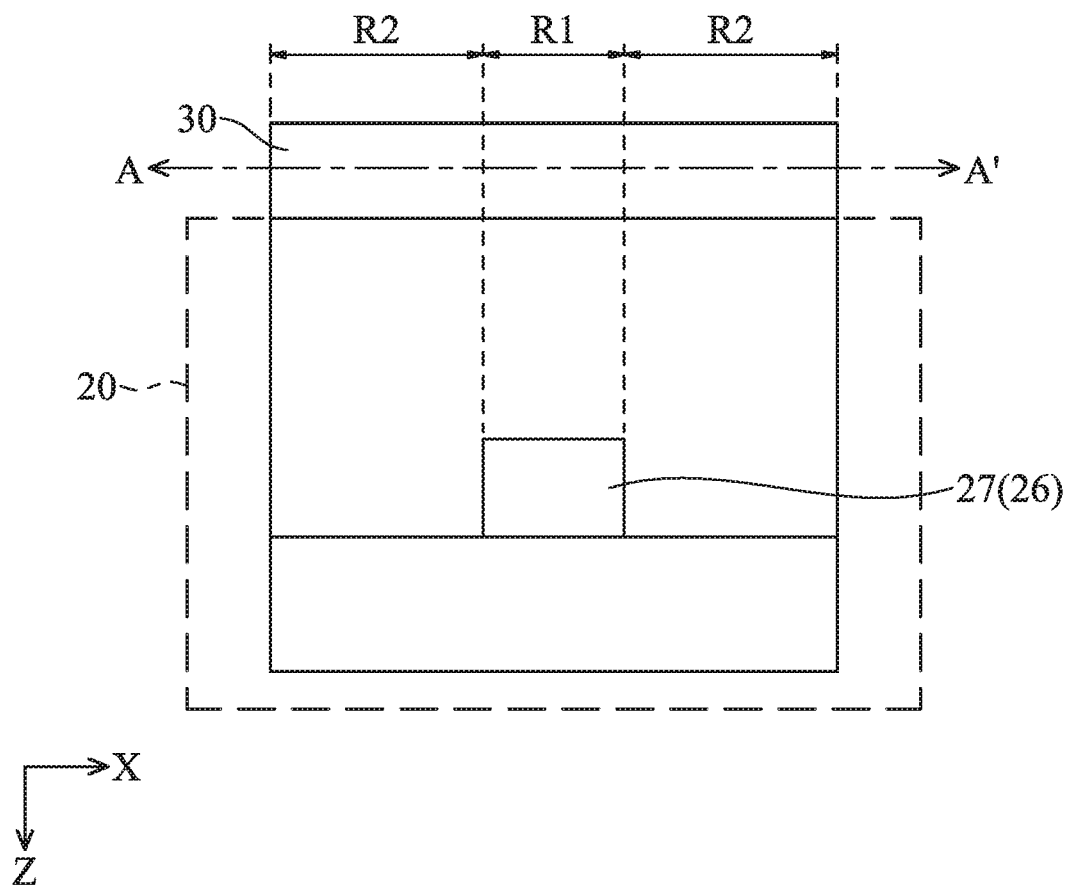
FIG. 4 is a schematic view of some embodiments of the present disclosure.

FIG. 4 is a schematic view in some embodiments of the present disclosure, and FIGS. 5A to 5D and FIGS. 6A to 6B are top views of the embodiments having different optical layers. The optical layer 30 in FIG. 4 may be substituted by the optical layers in FIGS. 5A to 5D and FIGS. 6A to 6B, depending on design requirements.

Figure 5A:
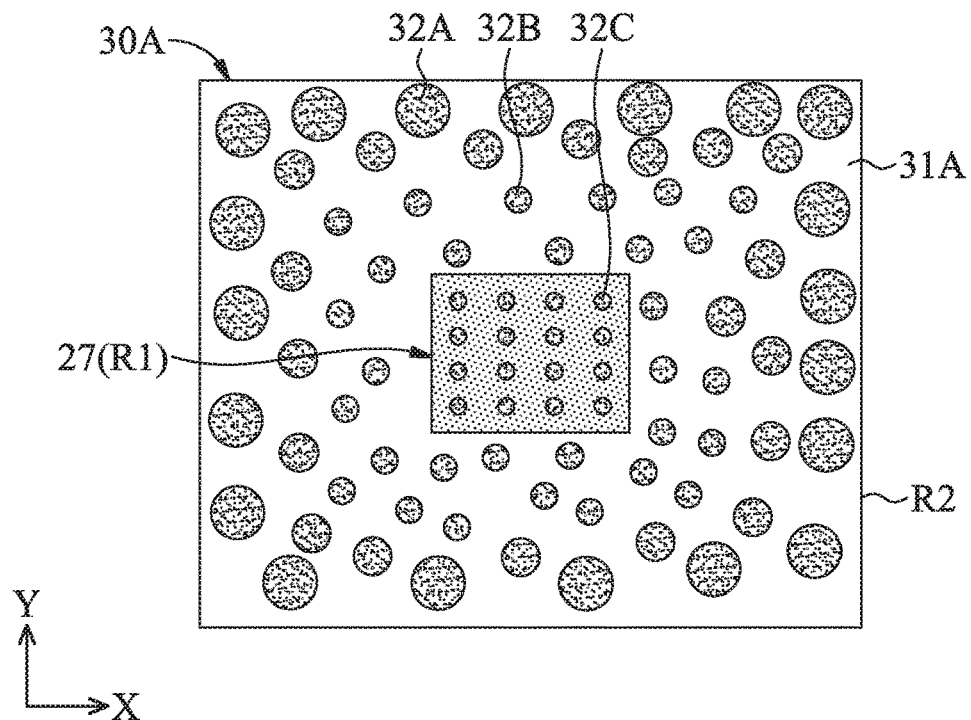
FIGS. 5A to 5D are top views of some embodiments of the present disclosure.
Figure 5B:
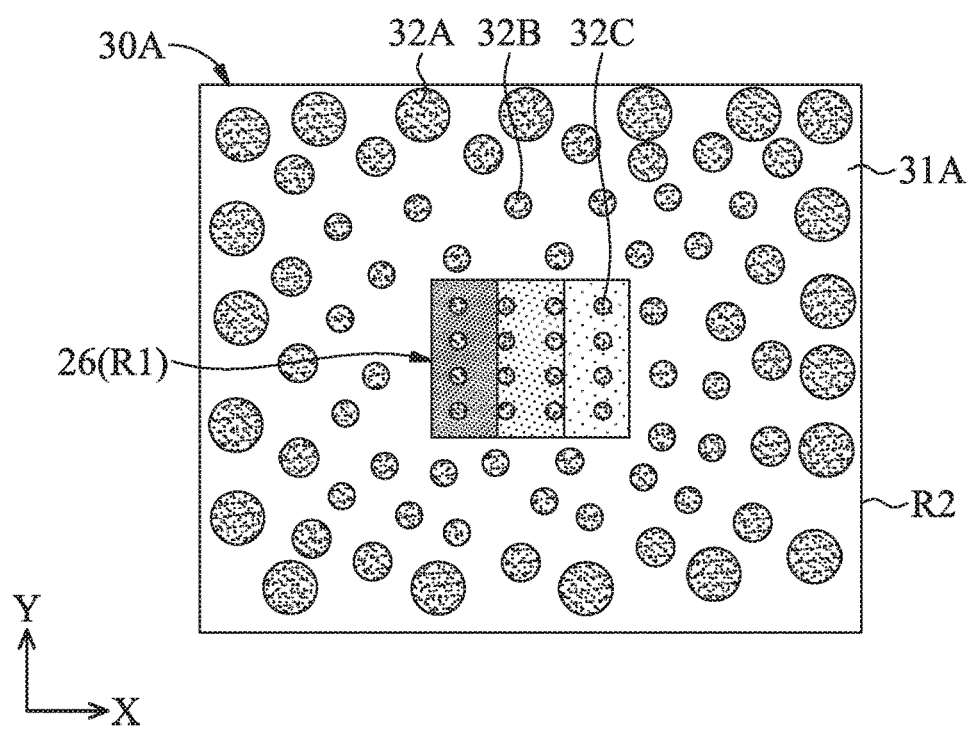

In FIGS. 4, 5A and 5B, the optical layer 30A (which equals to the optical layer 30 in FIG. 4) may include a first region R1 and a second region R2. As shown in FIGS. 4, 5A and 5B, the first region R1 may be a region that overlaps the light-emitting chip assembly 26 or the light-emitting chip 27 in the top view direction, and the second region R2 may be a region that does not overlap the light-emitting chip assembly 26 or the light-emitting chip 27 in the top view direction. In other words, the first region R1 is a union of the orthogonal projections of the light-emitting chips of the light-emitting chip assembly 26 or the orthogonal projection of the light-emitting chip 27. Moreover, as shown in FIG. 5B, the area of the first region R1 is the sum of the areas of the light-emitting chip 26A, light-emitting chip 26B and light-emitting chip 26C if the light-emitting chip assembly 26 has light-emitting chip 26A, light-emitting chip 26B and light-emitting chip 26C.

In some embodiments, the optical layer 30A may include optical material 31A and a plurality of holes 32A, holes 32B, and holes 32C in the optical material 31A. The optical material 31A may include materials with high reflectance, such as a metal or another complex material having a different refractive index, but the present disclosure is not limited thereto. In some embodiments, the metal may be silver, aluminum, gold, nickel, another suitable material, or a combination thereof, but it is not limited thereto. The complex material may include $TiO_2$, $SiO_2$, $Nb_2O_5$, $Ta_2O_5$, $ZrO_2$, $Al_2O_3$, $Y_2O_3$, MgO, or a combination thereof, but it is not limited thereto.

In some embodiments, as shown in FIGS. 5A and 5B, the holes 32C may position in the first region, and the holes 32A and the holes 32B may position in the second region R2 when viewed in the top view direction. More specifically, in the top view, the holes 32C overlap the light-emitting chip assembly 26 (or the light-emitting chip 27), the holes 32A and the holes 32B are spaced from the light-emitting chip assembly 26 (or the light-emitting chip 27) for a distance, and the distance between the holes 32B to the light-emitting chip assembly 26 or the light-emitting chip 27 (i.e. the shortest distance between the edge of the projection of the holes 32B and the edge of the projection of the light-emitting chip assembly 26 or the light-emitting chip 27 when viewed in the top view direction) is less than the distance between the holes 32A to the light-emitting chip assembly 26 or the light-emitting chip 27. Moreover, the area density of the holes 32C in the first region R1 is less than the area density of the holes 32A and the holes 32B in the second region R2.

It should be noted that the term "area density" refers to the proportion of the total projection area of the holes (or the gaps, or the light blocking patterns described later) in the per-unit area of the optical layer in the top view direction. The area of the first region R1 is the area of the optical layer that overlaps either the light-emitting chip assembly 26 or the light-emitting chip 27, when viewed in the top view direction. The area of the second region R2 is the area of the optical layer that does not overlap the light-emitting chip assembly 26 or the light-emitting chip 27, when viewed in the top view direction. It should be noted that in some embodiments, such as the embodiment shown in FIG. 10C, the optical layer may be provided continuously, and area of the second region R2 may be measured within a square region having several millimeters side length rather than measuring the whole optical layer. Furthermore, in some embodiments, the light-emitting chips of the light-emitting chip assembly 26 may be separated with each other, the first region R1 may be the portions that overlap the light-emitting chips in the top view direction, and the area of the first region R1 may be the sum of the areas of the portions that overlap the light-emitting chips.

As a result, the transmittance of the optical layer 30A may increase from its center to its edge. In other words, the transmittance of the first region R1 may be less than the transmittance of the second region R2. Therefore, the light emitted from the light-emitting chip assembly 26 or the light-emitting chip 27 to the first region R1 may tend to be reflected rather than passing through the optical layer to achieve the performance shown in FIG. 2B to solve the problem that the light-emitting intensity decaying rapidly along the viewing angle. It should be noted that in the present disclosure, the transmittance means the proportion of the intensity of emitted light and the intensity of incident light. In other words, transmittance=intensity of emitted light/intensity of incident light. The intensity of incident light in the present disclosure is defined as the intensity of the light exited from the encapsulation and entering into the optical layer. The intensity of emitted light in the present disclosure is defined as the intensity of the light exited from the optical layer.

In some embodiments, the size of the hole 32A (such as the greatest width) may be greater than the size of the hole 32B, and the size of the hole 32B may be greater than the size of the hole 32C, so the area density of the holes in the first region R1 is less than the area density of the holes in the second region R2. However, the present disclosure is not limited thereto. For example, the hole 32A, hole 32B, and hole 32C may have identical sizes, and the area density of the holes may be changed by changing the number of holes per unit area. In other words, there are more holes per unit area in the second region than in the first region, but it is not limited thereto.

Figure 5C:
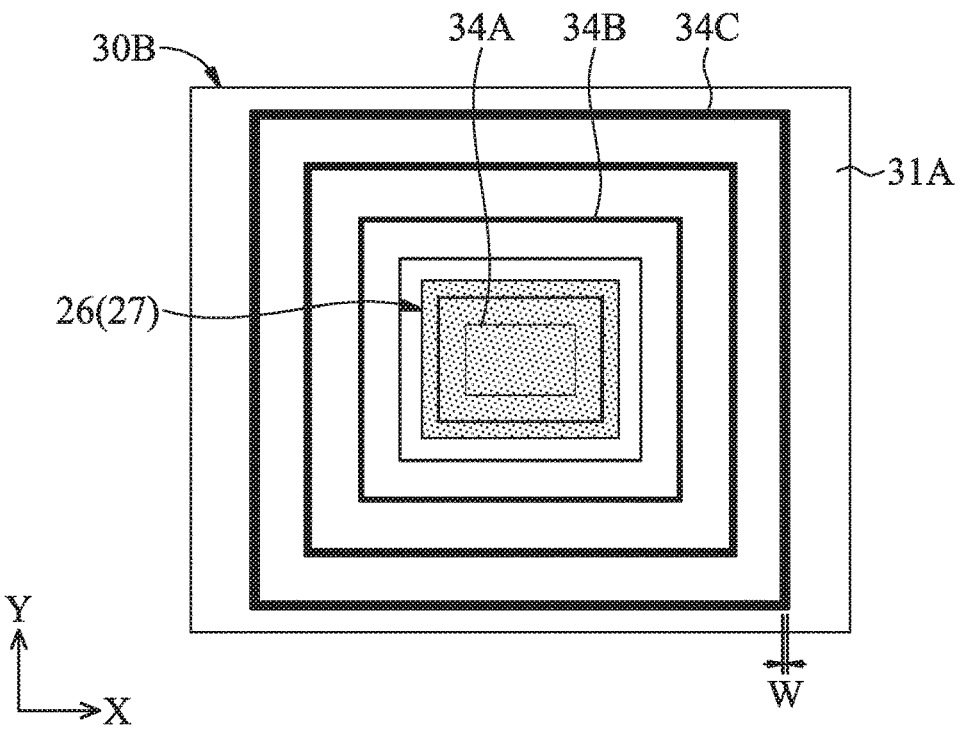
Figure 5D:
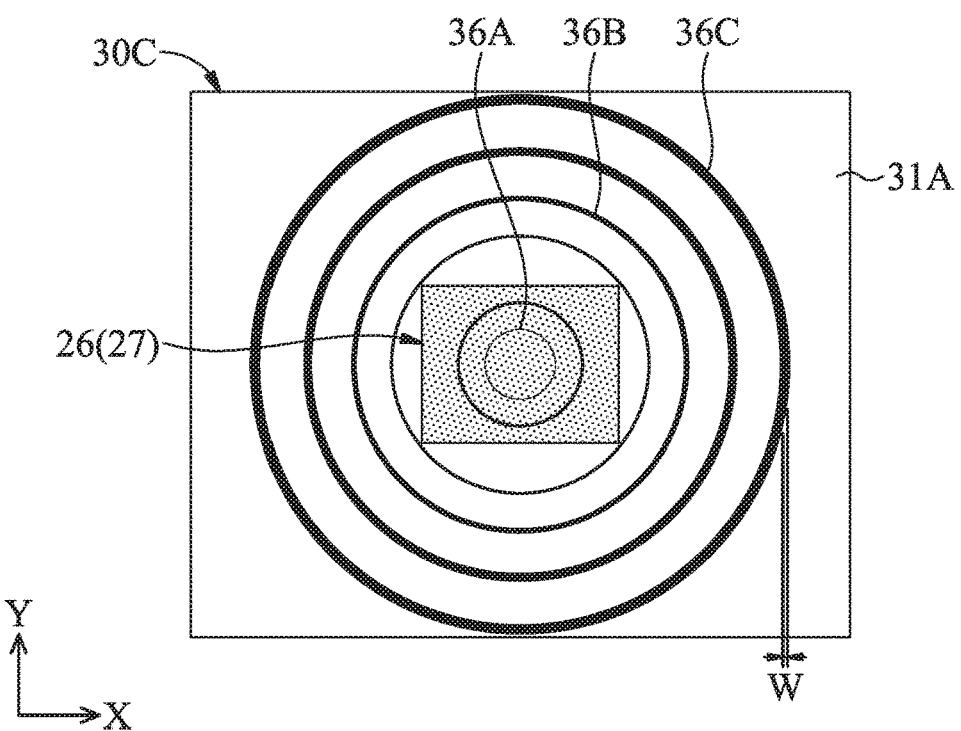

In some embodiments, to achieve the aforementioned effect, gaps with different area densities may be provided on the optical layer. For example, FIGS. 5C and 5D are top views of light-emitting devices in some embodiments of the present disclosure. Rectangular gap 34A, rectangular gap 34B, and rectangular gap 34C are provided on the optical layer 30B in FIG. 5C, and circular gap 36A, circular gap 36B, and circular gap 36C are provided on the optical layer 30C in FIG. 5D, such as concentric circles, but the present disclosure is not limited thereto. It should be noted that the rectangular gap 34A or the circular gap 36A are positioned at the first region R1, and the rectangular gap 34B, rectangular gap 34C or the circular gap 36B, circular gap 36C are positioned at the second region R2. The distance between the rectangular gap 34B to the first region R1 (i.e. the shortest distance between the projection of the rectangular gap 34B and the projection of the edges of the light-emitting chip assembly 26 or the light-emitting chip 27 in the top view direction, and the distance of other gaps are measured in the same way) is less than the distance between the rectangular gap 34C and the first region R1, the distance between the circular gap 36B and the first region R1 is less than the distance between the circular gap 36C and the first region R1, and the widths W of the rectangular gap 34A, rectangular gap 34B, and rectangular gap 34C (or the widths W of the circular gap 36A, circular gap 36B, and circular gap 36C) may increase as being farther from the center of the optical layer 30C (or the optical layer 30D). Therefore, the area density of the gaps in the first region R1 may be less than the area density of the gaps in the second region R2, and the transmittance of the optical layer 30B or the optical layer 30C may increase from the center to the edge, that is, the transmittance of the first region R1 is less than the transmittance of the second region R2. Therefore, the problem of the light-emitting intensity decaying rapidly along the viewing angle may be solved.

Figure 6A:
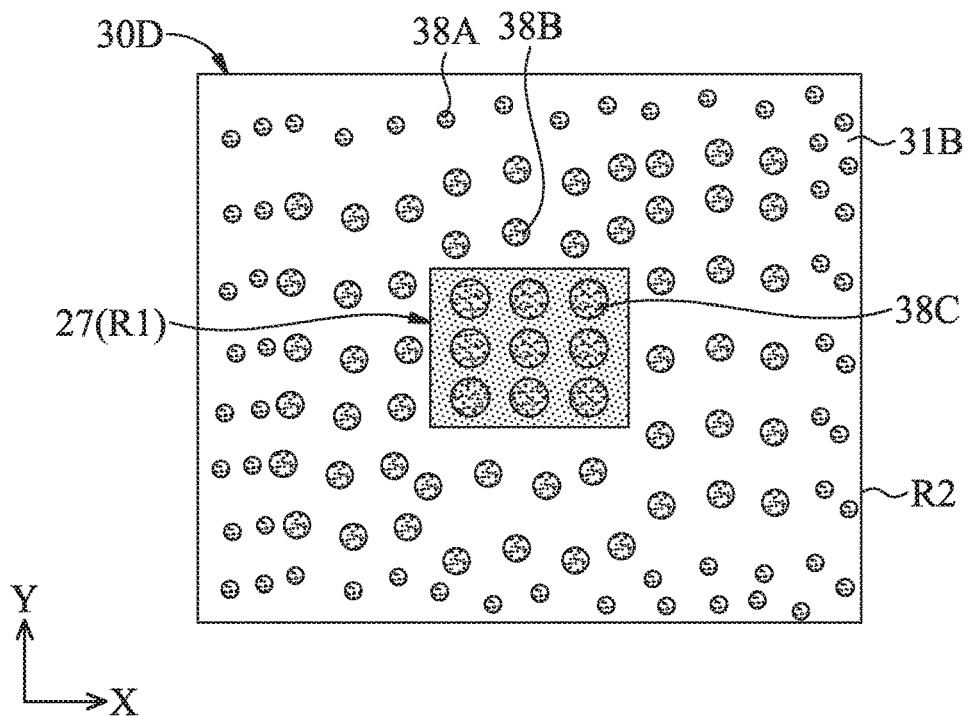
FIGS. 6A and 6B are top views of some embodiments of the present disclosure.
Figure 6B:
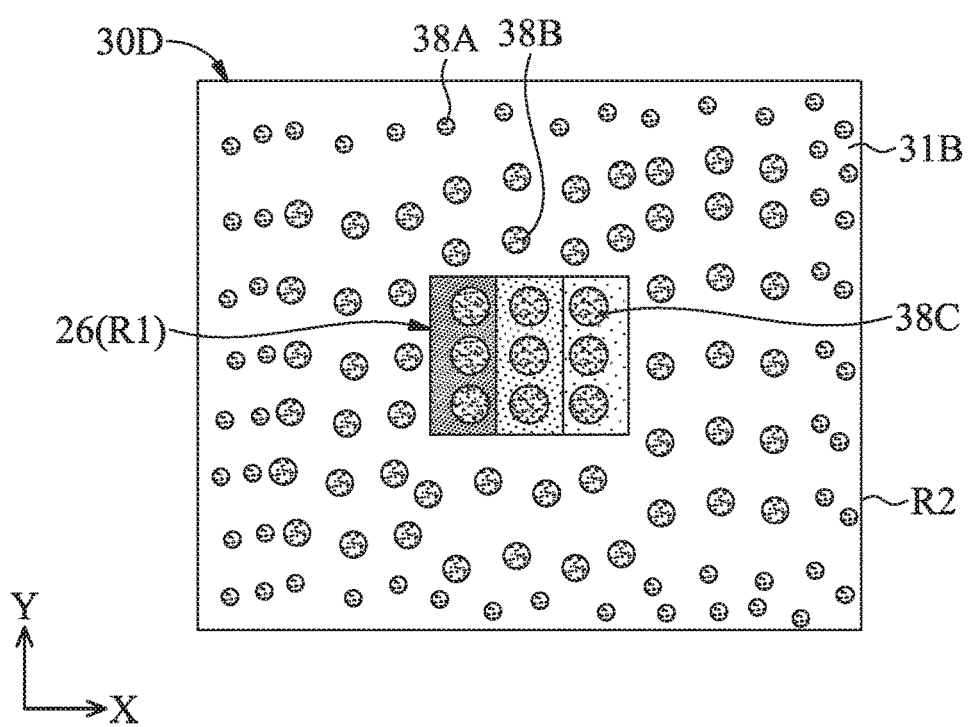

In the aforementioned embodiments, although the light-emitting intensity at different viewing angle is modified by the combination of the optical material 31A having high reflectivity and holes or gaps, the present disclosure is not limited thereto. For example, in some embodiments, as shown in FIGS. 6A and 6B, optical material 31B having high transmittance (such as higher than the optical material 31A) may be provided in the optical layer 30D, and a plurality of light blocking pattern 38A, light blocking pattern 38B, and light blocking pattern 38C may be disposed in the optical material 31B. The light blocking pattern 38A, light blocking pattern 38B, and light blocking pattern 38C may include reflective material similar to the optical material 31A, but it is not limited thereto. In some embodiments, the light blocking pattern 38A, light blocking pattern 38B, and light blocking pattern 38C may have materials that can absorb light.

The light blocking patterns 38C may be disposed in the first region R1, and the light blocking pattern 38A and light blocking pattern 38B may be disposed in the second region R2. In some embodiments, the size of light blocking pattern 38A (e.g. the greatest width) may be less than the size of the light blocking pattern 38B, and the size of the light blocking pattern 38B may be less than the size of the light blocking pattern 38C to make the area density of the light blocking pattern in the first region R1 greater than the area density of the light blocking pattern in the second region R2. Therefore, the problem of the light-emitting intensity decaying rapidly along the viewing angle may be solved.

Although three kinds of hole 32A, hole 32B, hole 32C, rectangular gap 34A, rectangular gap 34B, rectangular gap 34C, circular gap 36A, circular gap 36B, circular gap 36C, and light blocking pattern 38A, light blocking pattern 38B, light blocking pattern 38C are described in the aforementioned embodiments, but they are only examples, the present disclosure is not limited thereto. For example, the holes, gaps, or light blocking patterns may have identical size or more than three kinds of sizes, depending on design requirement.

Figure 7:
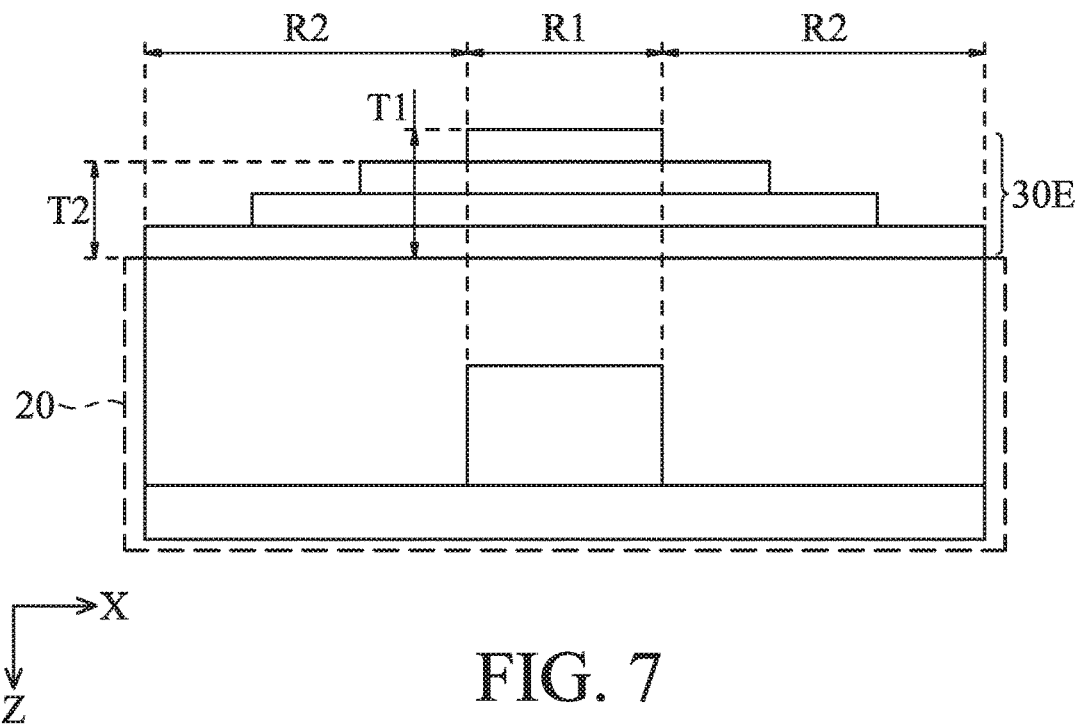
FIG. 7 is a schematic view of some embodiments of the present disclosure.

Furthermore, the reflectivity of the optical layer in different position may be changed by the different thickness of the optical layer in different regions. For example, in FIG. 7, the optical layer 30E may has a multilayer structure, and the thickness T1 of the optical layer 30E in the first region R1 is greater than the thickness T2 of the optical layer 30E in the second region R2, such as more layers of optical layers are provided in the first region. Alternatively, the optical layer may be a single layer that has a greater thickness at the center than the edge. As a result, the transmittance of the first region R1 is less than the transmittance of the second region R2 to solve the problem that the light-emitting intensity decaying rapidly along the viewing angle. It should be noted that the thicknesses of the optical layer in the first region R1 and in the second region R2 are respectively defined as the greatest distances from the top surface of the optical layer 30E in the first region R1 and in the second region R2 to the top surface of the light-emitting unit 20 in the top view direction.

Figure 8:
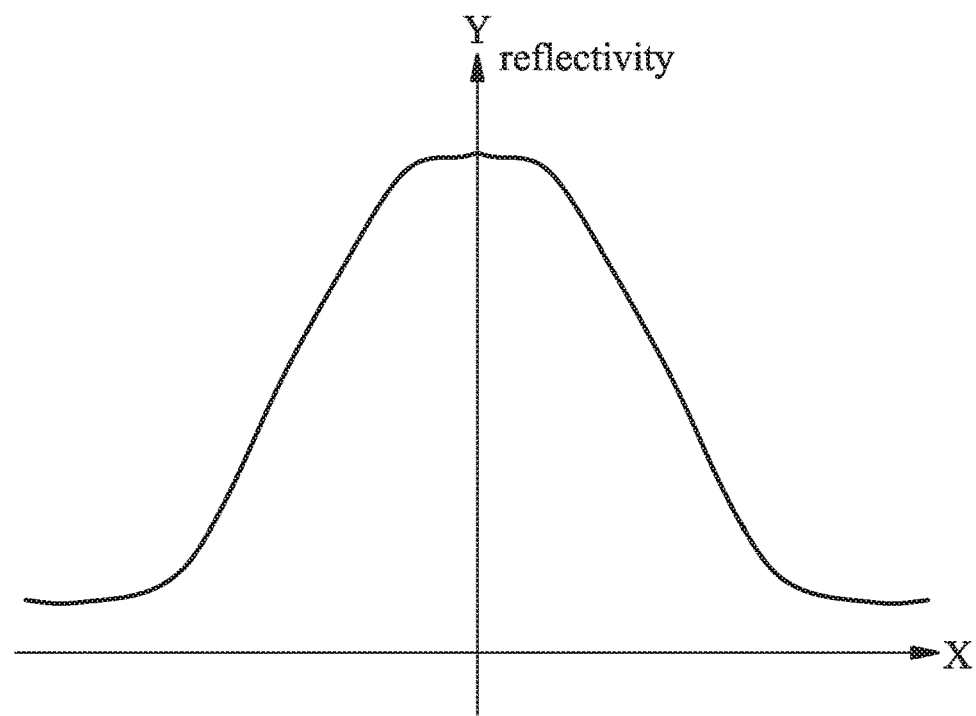
FIG. 8 is a schematic view showing the reflectivity of an optical layer in different positions in some embodiments of the present disclosure.

FIG. 8 is a schematic view showing the reflectivity of an optical layer in different positions in some embodiments of the present disclosure, such as the embodiments in FIG. 4 to FIG. 7. The X axis of FIG. 7 corresponds to the position (as along line A-A' in FIG. 4, wherein the original point is the center of the light-emitting chip assembly 26 or the light-emitting chip 27), and the Y axis of FIG. 7 corresponds to the reflectivity of the optical layer. It should be noted that the closer to the center of the light-emitting chip assembly 26 or the light-emitting chip 27 in the X axis, the higher the reflectivity of the optical layer. As a result, when the viewing angle is small (near the top view direction of the substrate of the light-emitting device), the light may be reflected by the optical layer more easily and emitted from the position corresponds to a larger viewing angle.

Figure 9A:
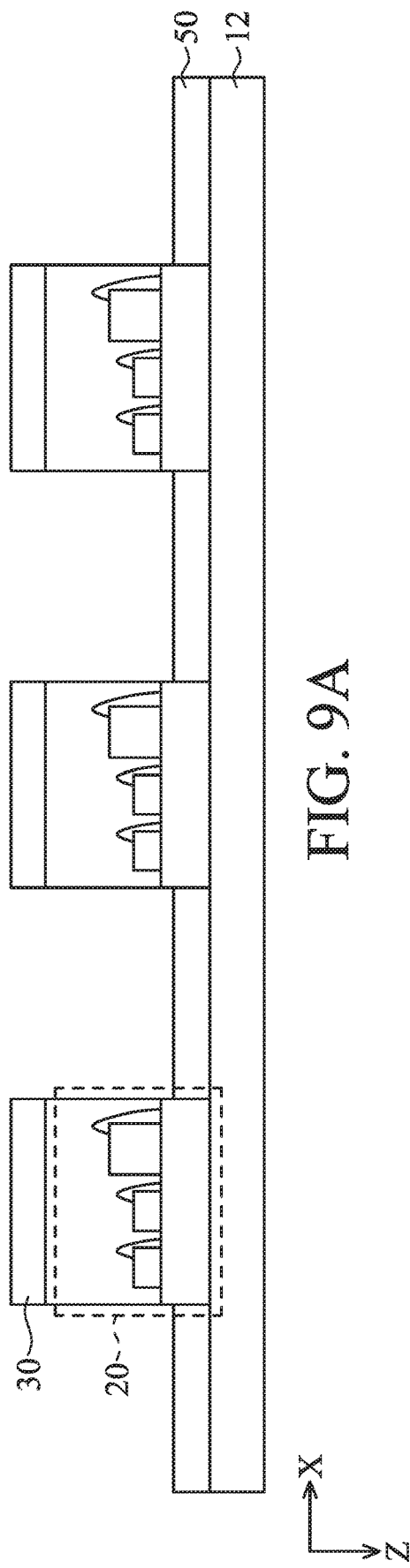
FIGS. 9A and 9B are schematic views of some elements of light-emitting devices in some embodiments of the present disclosure.
Figure 9B:
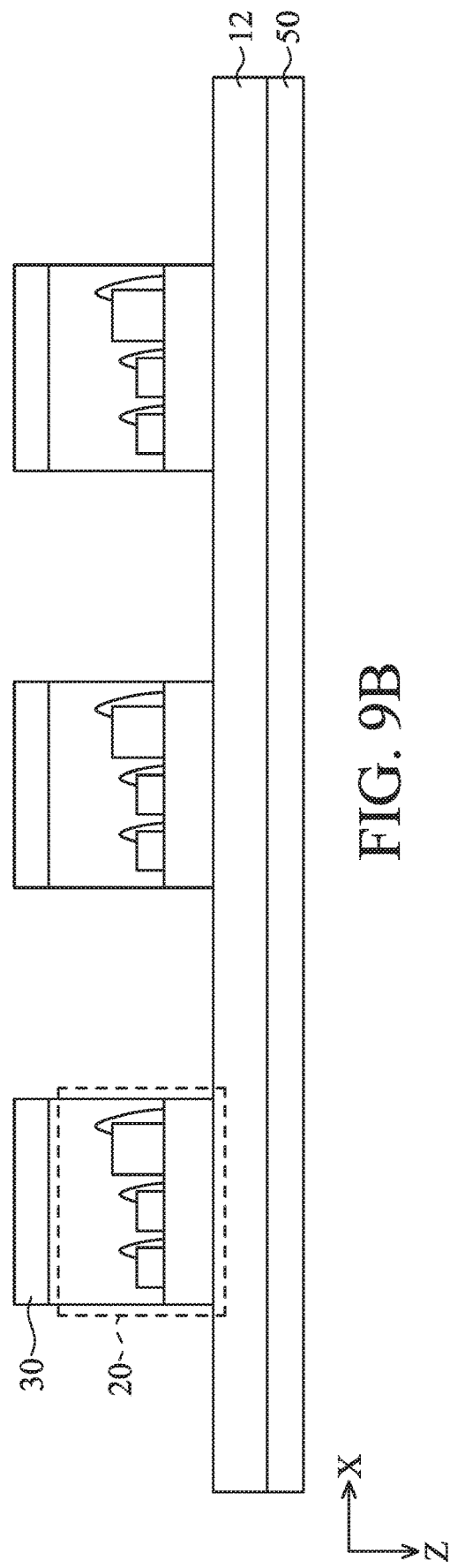

In some embodiments, as shown in FIGS. 9A and 9B, the light-emitting unit 20 and optical layer 30 may be disposed on a transparent substrate 12, and a reflective layer 50 may be disposed on the substrate 12. The substrate 12 may include transparent materials such as glass, polyimide, other suitable materials or a combination thereof, but it is not limited thereto. Furthermore, the substrate 12 may include thin-film transistor (TFT) or driving circuit (not shown). The driving circuit may be active driving circuit or passive driving circuit. In some embodiments, the driving circuit may include transistors (such as switching transistor or driving transistor), data lines, scanning lines, conductive pads, dielectric layers or another circuit, but it is not limited thereto.

The reflective layer 50 may include a material having reflective properties. In some embodiments, the material of the reflective layer 50 may include a metal. For example, the metal may include, but is not limited to, copper (Cu), aluminum (Al), indium (In), ruthenium (Ru), tin (Sn), gold (Au), platinum (Pt), zinc (Zn), silver (Ag), titanium (Ti), lead (Pb), nickel (Ni), chromium (Cr), magnesium (Mg), palladium (Pd), an alloy thereof, other suitable materials, or a combination thereof, but it is not limited thereto. In some other embodiments, the material of the reflective layer 50 may further include titanium dioxide, silicon dioxide or a combination thereof. In some embodiments, the reflective layer 50 and the light-emitting unit 20 may be disposed at an identical side of the substrate 12 (as shown in FIG. 9A), or the reflective layer 50 and the light-emitting unit 20 may be disposed at different sides of the substrate 12 (as shown in FIG. 9B), but it is not limited thereto. Therefore, the light emitted to the substrate 12 may be reflected to the display layer (such as the display layer 42 in FIG. 3A), increasing the brightness of the light-emitting device.

In some embodiments, the reflective layer 50 may be formed from deposition, coating, printing, inkjet printing, compression molding, other suitable methods or a combination thereof, or the reflective layer 50 may be formed by one or more photolithography processes and etching processes.

In the aforementioned embodiments, the encapsulation substrate 22 is positioned between the light-emitting chip assembly 26 and the substrate 10, but the present disclosure is not limited thereto. FIGS. 10A to 10E are schematic views of some elements of light-emitting devices in some embodiments of the present disclosure. In FIG. 10A, the light-emitting chip assembly 26 of the light-emitting device 4A may be disposed on the substrate 10, and no encapsulation substrate 22 is provided. Driving circuit (not shown) of the light-emitting chip assembly 26 may be provided on the surface of the substrate 10. As a result, the manufacture process of the light-emitting device 4A may be simplified.

Moreover, the substrate 10 may be substituted by the combination of the transparent substrate 12 and the reflective layer 50. For example, in FIGS. 10B to 10E, the light-emitting device 4B, light-emitting device 4C, light-emitting device 4D, and light-emitting device 4E have the transparent substrate 12 and the reflective layer 50, wherein the reflective layer 50 and the light-emitting chip assembly 26 are disposed on different sides of the substrate 12 in the light-emitting device 4B and light-emitting device 4C, and the reflective layer 50 and the light-emitting chip assembly 26 are disposed on an identical side of the substrate 12 in the light-emitting device 4D and light-emitting device 4E. Furthermore, in some embodiments, the optical layer 30 may cover the light-emitting chip assembly 26 and expose a portion of the top surface of the encapsulation 24 (as shown in FIG. 10B), or the optical layer 30 may cover the entire top surface of the encapsulation 24 (as shown in FIG. 10C), depending on design requirement.

It should be noted that in the aforementioned embodiments, more than one emitting chip assemblies 26 may be disposed in an identical encapsulation 24, such as packaged in an identical encapsulation 24 to simplify the required manufacturing process, but the present disclosure is not limited thereto. For example, in FIG. 10E, the emitting chip assemblies 26 are disposed in different encapsulations 24.

Figure 11:
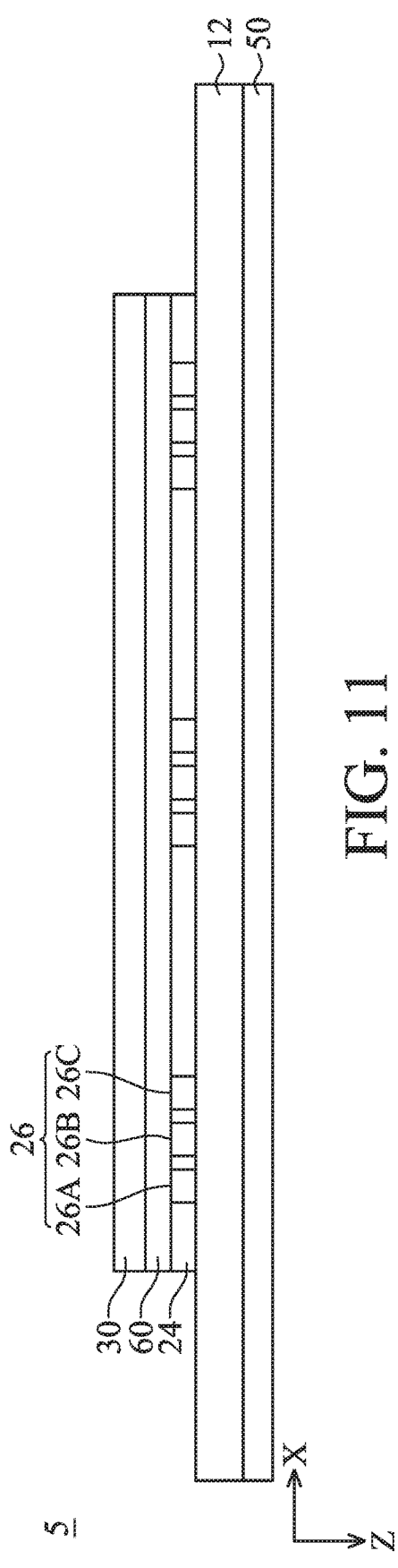
FIG. 11 is a schematic view of some elements of a light-emitting device in some embodiments of the present disclosure.

In some embodiments, as shown in the light-emitting device 5 in FIG. 11, an additional light guide layer 60 may be provided between the light-emitting chip assembly 26 and the optical layer 30 to make the light emitted from the light-emitting chip assembly 26 uniform. The material of the light guide layer may be, for example, plastic, glass, polyimide, sapphire, other suitable materials or a combination thereof, but it is not limited thereto. Moreover, in some embodiments, the top surface of the light-emitting chip assembly 26 (the surface away from the substrate 12) may directly contact the light guide layer 60, or a portion of the encapsulation 24 may be positioned between the light-emitting chip assembly 26 and the light guide layer 60, but it is not limited thereto.

Figure 12:
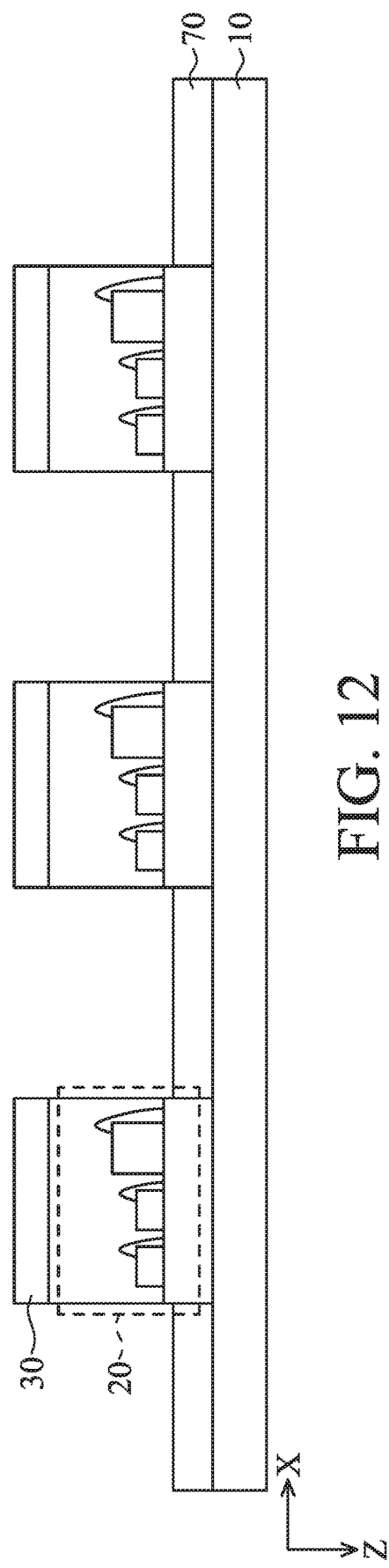
FIG. 12 is a schematic view of some elements of a light-emitting device in some embodiments of the present disclosure.

In some embodiments, an additional anti-reflective layer may be disposed on the substrate of the light-emitting device to reduce that the external light is reflected by the substrate to the light-emitting chip and weaken the performance of light-emitting chip. For example, as shown in FIG. 12, an anti-reflective layer 70 is provided on the substrate 10 of the light-emitting device 6. The material of the anti-reflective layer 70 may include low reflectivity material, such as a black photoresist or a light absorptive adhesive, but it is not limited thereto. As a result, the interference due to the light reflection between adjacent light-emitting devices may be reduced, and the lifetime of the light-emitting device may be increased. On the other hand, when the light-emitting device 6 is used in outdoor environment, the image quality may be less affected by the reflected ambient light, such as sun light. When the light-emitting device 6 is used as a display device, the light-emitting chip assembly 26 of light-emitting device 6 may be pixels to directly show images.

In some embodiments, the anti-reflective layer 70 may be formed from the aforementioned deposition, coating, printing, inkjet printing, compression molding, another suitable method, or a combination thereof. As an alternative, the anti-reflective layer 70 may be formed by one or more photolithography processes and etching processes.

In summary, a light-emitting device having an optical layer on the light-emitting unit is provided in some embodiments of the present disclosure. By using the optical layer having different transmittance in different regions, the problem of the light-emitting intensity decaying rapidly along the viewing angle may be solved, improving the performance of the light-emitting device. Since the aforementioned embodiments in the disclosure may perform substantially the same function and obtain substantially the same results, some embodiments of the present disclosure may be combined without conflicting with the spirit of the disclosure.

The light-emitting device may have touch-control functionality, to act as a touch-electronic device. Furthermore, the light-emitting device or touch-electronic device in the embodiments of the present disclosure may be applied in any electronic devices with a display screen, such as a display, a mobile phone, a watch, a laptop computer, a video camera, a camera, a mobile navigation device, or a television. These are merely examples, and the applications of the present disclosure are not limited thereto. The touch-electronic device of the aforementioned embodiments of the present disclosure may be applied in an electronic device that has an antenna, or in other types of electronic devices.

Although embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope of such processes, machines, manufacture, and compositions of matter, means, methods, or steps. In addition, each claim constitutes a separate embodiment, and the combination of various claims and embodiments are within the scope of the disclosure.

What is claimed is:

1. A light-emitting device, comprising:
a substrate;
a light-emitting unit disposed on the substrate and comprising an encapsulation substrate, a light-emitting chip and an encapsulation, wherein the light-emitting chip and the encapsulation are disposed on the encapsulation substrate, and the encapsulation substrate is disposed between the substrate and the light-emitting chip; and
an optical layer disposed on the light-emitting unit, the optical layer having a first region overlapping the light-emitting chip in a top view direction of the light-emitting device and a second region not overlapping the light-emitting chip but overlapping the encapsulation substrate in the top view direction of the light-emitting device;
wherein a transmittance of the first region is less than a transmittance of the second region;
wherein sidewalls of the encapsulation substrate align with sidewalls of the optical layer.

2. The light-emitting device as claimed in claim 1, wherein the optical layer comprises a plurality of holes, and an area density of the plurality of holes in the first region is less than an area density of the plurality of holes in the second region.

3. The light-emitting device as claimed in claim 1, wherein the optical layer comprises a plurality of gaps, and widths of the gaps increase as being farther from a center of the optical layer.

4. The light-emitting device as claimed in claim 1, wherein the optical layer comprises a plurality of light blocking patterns, and an area density of the plurality of light blocking patterns in the first region is greater than an area density of the plurality of light blocking patterns in the second region.

5. The light-emitting device as claimed in claim 1, wherein a thickness of the first region is greater than a thickness of the second region.

6. The light-emitting device as claimed in claim 5, wherein the optical layer has a multilayer structure, and more layers of optical layers are provided in the first region than in the second region.

7. The light-emitting device as claimed in claim 1, wherein the optical layer comprises a metal material.

8. The light-emitting device as claimed in claim 7, wherein the metal material comprises Ag, Al, Au, Ni, or a combination thereof.

9. The light-emitting device as claimed in claim 1, wherein the optical layer comprises a composite material comprising $TiO_2$, $SiO_2$, $Nb_2O_5$, $Ta_2O_5$, $ZrO_2$, $Al_2O_3$, $Y_2O_3$, MgO, or a combination thereof.

10. The light-emitting device as claimed in claim 1, wherein the optical layer is a distributed Bragg reflector.

11. The light-emitting device as claimed in claim 1, wherein the light-emitting unit further comprises another light-emitting chip.

12. The light-emitting device as claimed in claim 11, wherein the another light-emitting chip and the light-emitting chip emit different color lights.

13. The light-emitting device as claimed in claim 1, further comprising a light guide layer disposed between the light-emitting unit and the optical layer.

14. The light-emitting device as claimed in claim 1, wherein the light-emitting chip has a first electrode layer and a second electrode layer.

15. A light-emitting device, comprising:
   a backlight unit, comprising:
   a substrate;
   a light-emitting unit disposed on the substrate, and comprising an encapsulation substrate, a light-emitting chip, and an encapsulation, wherein the encapsulation substrate is disposed between the substrate and the light-emitting chip;
   an optical layer disposed on the light-emitting unit; and
   an optical film disposed on the optical layer; and
   a display layer disposed on the backlight unit,
   wherein the light-emitting chip and the encapsulation are disposed on the encapsulation substrate, the optical layer has a first region overlapping the light-emitting chip in a top view direction of the light-emitting device and a second region not overlapping the light-emitting chip but overlapping the encapsulation substrate in the top view direction of the light-emitting device, and a transmittance of the first region is less than a transmittance of the second region;
   wherein sidewalls of the encapsulation substrate align with sidewalls of the optical layer.

16. The light-emitting device as claimed in claim 15, wherein the backlight unit comprises a wavelength conversion layer disposed on the optical layer.

17. A light-emitting device, comprising:
   a substrate;
   a light-emitting unit on the substrate, comprising:
   a light-emitting chip disposed on the substrate;
   an encapsulation disposed on the substrate; and
   an encapsulation substrate, wherein the light-emitting chip and the encapsulation are disposed on the encapsulation substrate, and the encapsulation substrate is disposed between the substrate and the light-emitting chip; and
   an optical layer disposed on the light-emitting unit,
   wherein the optical layer has a first region overlapping the light-emitting chip in a top view direction of the light-emitting device and a second region not overlapping the light-emitting chip but overlapping the encapsulation substrate in the top view direction of the light-emitting device, and a transmittance of the first region is less than a transmittance of the second region;
   wherein sidewalls of the encapsulation substrate align with sidewalls of the optical layer.

18. The light-emitting device as claimed in claim 17, further comprising a reflective layer, wherein the reflective layer and the light-emitting chip are disposed at an identical side of the substrate.

19. The light-emitting device as claimed in claim 17, further comprising a reflective layer, wherein the reflective layer and the light-emitting chip are disposed on different sides of the substrate.

\* \* \* \* \*